United States Patent

Ohta et al.

[11] Patent Number: 5,421,288
[45] Date of Patent: Jun. 6, 1995

[54] PROCESS FOR GROWING SILICON EPITAXIAL LAYER

[75] Inventors: Yutaka Ohta; Takatoshi Nagoya, both of Annaka, Japan

[73] Assignee: Shin-Etsu Handotai Co., Ltd., Tokyo, Japan

[21] Appl. No.: 163,708

[22] Filed: Dec. 9, 1993

[30] Foreign Application Priority Data

Dec. 11, 1992 [JP] Japan ................... 4-352940
Jul. 8, 1993 [JP] Japan ................... 5-193194

[51] Int. Cl.$^6$ ........................... C30B 25/02
[52] U.S. Cl. ........................... 117/88; 117/84; 117/89; 118/724
[58] Field of Search .......... 117/4, 84, 88, 89, 90, 117/200, 204, 930, 935, 201, 202; 118/723; 437/973

[56] References Cited

U.S. PATENT DOCUMENTS

| | | | |
|---|---|---|---|
| 3,854,443 | 12/1974 | Baerg | 118/49 |
| 4,062,706 | 12/1977 | Ruehrwein | 117/89 |
| 4,421,786 | 12/1983 | Mahajan et al. | 117/88 |
| 5,134,965 | 8/1992 | Tokuda et al. | 118/723 |
| 5,227,330 | 7/1993 | Agnello et al. | 117/935 |

FOREIGN PATENT DOCUMENTS

| | | |
|---|---|---|
| 0318395 | 5/1989 | European Pat. Off. |
| 0410442 | 1/1991 | European Pat. Off. |
| 0473067 | 3/1992 | European Pat. Off. |
| 0550058 | 7/1993 | European Pat. Off. |

OTHER PUBLICATIONS

F. Mieno et al., "Low Temperature Silicon Epitaxy Using $Si_2H_6$", *Journal of the Electrochemical Society*, vol. 134, No. 9, pp. 2320-2323.

*Primary Examiner*—R. Bruce Breneman
*Assistant Examiner*—Felisa Garrett
*Attorney, Agent, or Firm*—Oliff & Berridge

[57] ABSTRACT

A process for growing a silicon epitaxial layer on the main surface of a silicon substrate wafer using an apparatus for growing a silicon epitaxial layer is disclosed. The apparatus comprises a central injector passing a flow of a reactive gas past a central part of a horizontal chamber, peripheral injectors passing peripheral flows of the reactive gas past a peripheral part of the chamber, a first controller controlling the mass flows of at least one of the silicon source, the dopant and hydrogen of the reactive gas fed by the central injector, and a second controller controlling the mass flows of at least one of the silicon source, the dopant and hydrogen fed by the peripheral injectors independently of the first controller. The process comprises control steps independently controlling the mass flows of the reactive gas by the first contoller and the second controller.

9 Claims, 6 Drawing Sheets

PROCESS FOR GROWING SILICON EPITAXIAL LAYER

BACKGROUND OF THE INVENTION

1. Field of the Invention

The present invention relates to a process and an apparatus for growing a silicon epitaxial layer on a silicon substrate wafer.

2. Description of the Related Art

FIG. 7 is a schematic diagram illustrative of a longitudinal sectional side view of a prior-art cold-wall type single-wafer-processing apparatus for growing a gas phase silicon epitaxial wafer. FIG. 8 is a schematic diagram illustrative of a longitudinal sectional plan view of the apparatus of FIG. 7. The apparatus 1 comprises a reactor A, a gas feeder system B, heaters 6 for heating silicon epitaxial wafers, a wafer transfer system (not shown), a control system (not shown) and a vacuum system (not shown).

The reactor A is made of quartz and has the form of an elongate housing defining a reaction chamber 2a, and a disc-shaped susceptor 4 mounted within the reactor A. The susceptor 4 holds a silicon substrate wafer 3 (a silicon epitaxial wafer has the same label as the silicon substrate wafer for convenience of description hereinafter) on the top surface thereof and is rotated in a horizontal plane during epitaxy. The susceptor 4 has a shaft 4a rigidly joined thereto and extending outside the reactor A. A motor (not shown) rotates the susceptor shaft 4a.

The gas feeder system B is fluidly connected to the reaction chamber 2 of the reactor A and comprises three injectors 5 arranged transversely to the longitudinal axis of the reactor A. The three injectors 5 have a common gas feed line having mass flow controllers (MFCs) for a reactive gas.

The heaters 6 are arranged outside and along the reactor A. Each heater 6 comprises, e.g., a halogen lamp.

The reactive gas consists of the silicon source (e.g. monosilane, dichlorosilane, trichlorosilane or tetrachlorosilane), a small volume of the dopant and hydrogen for diluting the silicon source and the dopant. The injectors 5 concurrently feed flows of the reactive gas of an equal silicon source concentration and an equal dopant concentration to the main surface of the wafer 3 on the susceptor 4. The MFCs control the silicon source concentration and the dopant concentration of the reactive gas fed to the three injectors 5.

The prior-art apparatus 1 has a drawback described below. The prior-art apparatus 1 controls the temperature of the susceptor 4 so that the temperature of the periphery of the susceptor 4 and the temperature of a central part of the susceptor 4 are equal. If the temperature of the periphery of the susceptor 4 differs from the temperature of the central part of the susceptor 4, the in-plane temperature distribution of the wafer 3 is not flat nor uniform, so that an epitaxial layer experiences a thermal stress and a grown silicon epitaxial wafer 3 has slip lines.

In addition, the prior-art apparatus 1 continues to cool the wall of the reactor A during epitaxy so that the interior surface of the wall of the reactor A precludes a deposition of silicon thereto. Therefore, even if the temperature of the periphery of the susceptor 4 and the temperature of the central part of the susceptor 4 are equal, the temperature of the central part flow of the reactive gas tends to be higher than the temperature of the peripheral part flow of the reactive gas. This expands the reactive gas of the central part flow to reduce the density of the reactive gas of the central part flow and drives the reactive gas of the central part flow to the peripheral part of the reaction chamber 2a. Thus, the density of the reactive gas of the central part flow is lower than the density of the reactive gas of the peripheral flow, so that the silicon source concentration in the central flow of the reactive gas is lower than that in the peripheral flow of the reactive gas. FIG. 2 indicates that the thickness of a central part of the epitaxial layer is thinner than the thickness of a peripheral part of the epitaxial layer.

The resistivity of the epitaxial layer depends on the intensity of the influence of the automatic doping (autodoping) of the back surface of the substrate wafer. The intensity of the influence of the autodoping on the peripheral part of the epitaxial layer is higher than the intensity of that on the central part of the epitaxial layer. For example, the influence of the autodoping reduces the resistivity of an $n/n^+$ or $p/p^+$ epitaxial layer so that the resistivity of a central part of the epitaxial layer thereof is higher than that of a peripheral part of the epitaxial layer thereof, as shown in FIG. 3. A growth of an epitaxial layer on the substrate wafer which has an oxide layer on the overall back surface reduces the influence of the autodoping. However, even in the case, a similar tendency appears.

In order to solve the drawback described above, the temperature of the central part of the substrate wafer 3 must be higher than that of the peripheral part thereof. This causes a thermal stress in the grown epitaxial layer to produce slip lines therein.

SUMMARY OF THE INVENTION

Therefore, the objective of the present invention is to provide a process and apparatus for growing a silicon epitaxial layer on a silicon substrate wafer to produce a slip-free silicon epitaxial wafer having a good in-plane thickness distribution and a good in-plane resistivity distribution of the epitaxial layer.

In order to achieve this objective, a first aspect of the present invention, in a process for growing a silicon epitaxial layer on the main surface of a silicon substrate wafer using an apparatus for growing a silicon epitaxial layer, the apparatus comprising a horizontal chamber, a susceptor mounted within the chamber, the top surface of the susceptor holding the silicon substrate wafer, and a series of injectors arranged transversely to the horizontal axis of the chamber and concurrently feeding parallel flows of a reactive gas into the chamber, the reactive gas consisting of a silicon source, a dopant and hydrogen. The process comprises the steps of rotating the susceptor in a horizontal plane, independently controlling the mass flows of at least one of the silicon source, the dopant and hydrogen in a central flow passing past a central part of the chamber and in a peripheral flow passing past a peripheral part of the chamber.

In the first aspect of the present invention, the injectors comprises a central injector passing the central flow of the reactive gas past the central part of the chamber and peripheral injectors passing corresponding peripheral flows of the reactive gas past the peripheral part of the chamber.

A second aspect of the present invention comprises, in an apparatus for growing a silicon epitaxial layer on the main surface of a silicon substrate wafer, a horizontal chamber, a susceptor mounted within the chamber, the top surface of the susceptor holding the silicon substrate wafer in a horizontal position so that the main surface of the silicon substrate wafer is facing upward, means for rotating the susceptor, a series of injectors arranged transversely to the horizontal axis of the chamber, the injectors comprising a central injector passing a central flow of a reactive gas past a central part of the chamber and peripheral injectors passing peripheral flows of the reactive gas past a peripheral part of the chamber, the reactive gas consisting of a silicon source, a dopant and hydrogen, a first gas feeder system connected to the central injector and feeding the reactive gas to the central injector, a second gas feeder system connected to the peripheral injectors and feeding the reactive gas to the peripheral injectors. A first controller provided in the first gas feeder system controls the mass flows of at least one of the silicon source, the dopant and hydrogen fed by the central injector, and a second controller provided in the second gas feeder system controls the mass flows of at least one of the silicon source, the dopant and hydrogen fed by the peripheral injector independently of the first controller.

Other aspect of the present invention is a process for growing a silicon epitaxial layer on the main surface of a silicon substrate wafer using an apparatus for growing a silicon epitaxial layer. The apparatus comprises a horizontal chamber, the chamber wall being made of quartz and being kept cool so that the temperature of a central part adjoining the horizontal axis of the chamber is higher than the temperature of a peripheral part adjoining the chamber wall, a susceptor mounted within the chamber and rotating in a horizontal plane during epitaxy, the top surface of the susceptor holding the silicon substrate wafer in a horizontal position so that the main surface of the silicon substrate wafer is facing upward, an exhaust gas outlet, and a series of injectors arranged transversely to the horizontal axis of the chamber. The injectors comprises a central injector passing a central flow of a reactive gas past a central part of the chamber and peripheral injectors passing peripheral flows of the reactive gas past peripheral parts of the chamber. The reactive gas consists of a silicon source, a dopant and hydrogen. The process comprises the steps of controlling the mass flows of at least one of the silicon source, the dopant and hydrogen in the central flow fed by the central injector, and independent of the first control step, controlling the mass flow of at least one of the silicon source, the dopant and hydrogen in the peripheral flow fed by the peripheral injectors, the first and second control steps being operated so that the density of the reactive gas of the central flow equals the density of the reactive gas of the peripheral flow in the chamber.

In other aspect, the silicon substrate wafer may have no autodoping protective seal on the back surface of the wafer.

The process and apparatus can produce a silicon epitaxial wafer of a high quality in which the in-plane distributions of the epitaxial layer thickness and the epitaxial layer resistivity are flat.

Other objects, features and advantages of the present invention will be apparent from a consideration of the following description, taken in connection with the accompanying drawing.

DETAILED DESCRIPTION OF THE PREFERRED EMBODIMENTS

Embodiments of the present invention will be described with reference to the drawings hereinafter.

Figure 1:
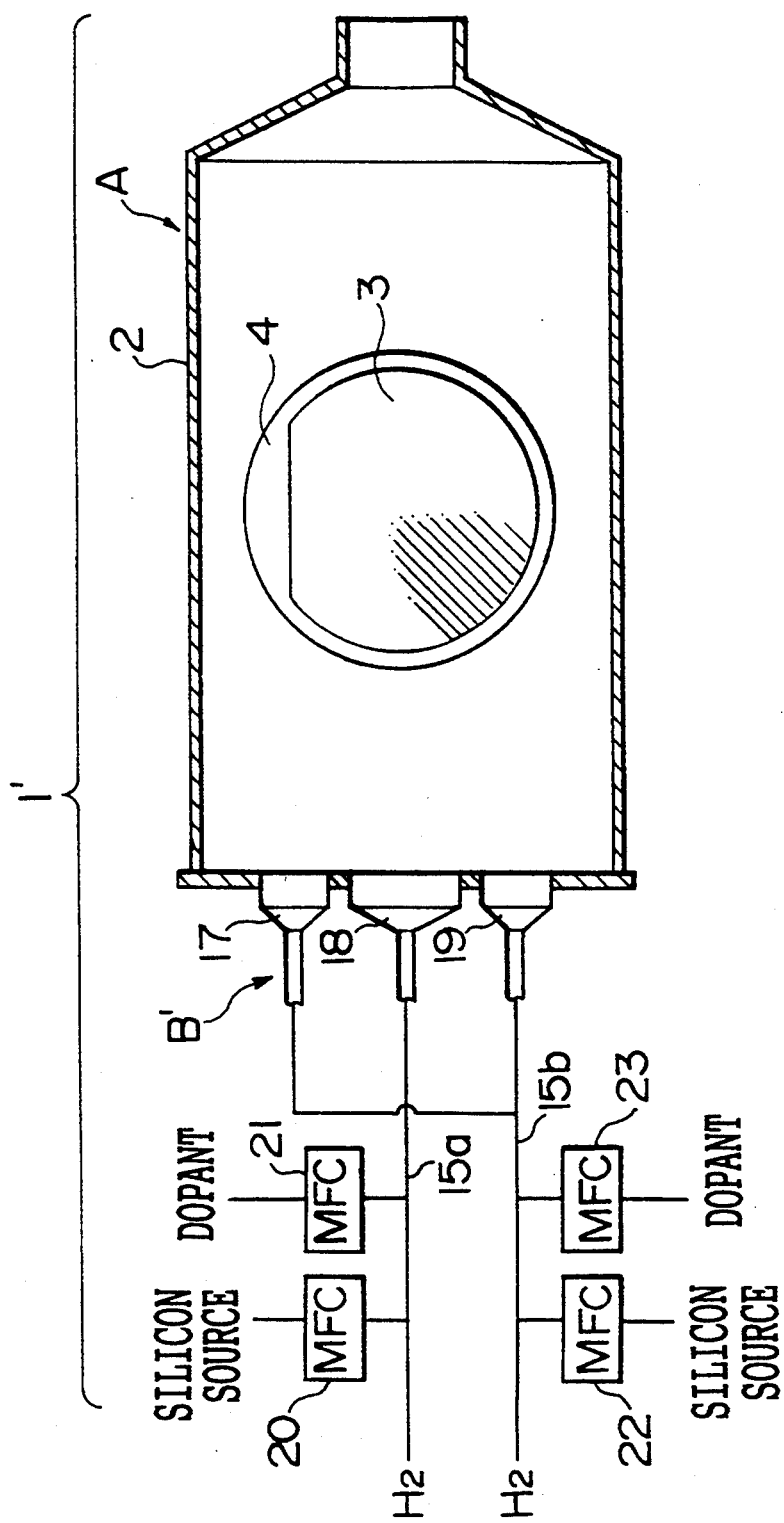
FIG. 1 is a schematic diagram of an apparatus for growing a silicon epitaxial layer according to a first embodiment of the present invention.

FIG. 1 illustrates a single-wafer-processing apparatus for growing a silicon epitaxial layer on a substrate wafer according to a first embodiment of the present invention. The apparatus 1' comprises a reactor A, a gas feeder system B', a wafer transfer system (not shown), heaters (not shown), a control system (not shown) and a vacuum system (not shown). The wafer transfer system, the reactor A, the heaters, the control system and the vacuum system of the apparatus 1' have the same structures as those of the prior-art apparatus 1. Therefore, descriptions of them will not be repeated hereinafter.

As shown in FIG. 1, the apparatus 1' comprises the gas feeder system B' different from the gas feeder system B of the prior-art apparatus 1. The gas feeder system B' is fluidly connected to the chamber 2 of the reactor A and a series of injectors 17, 18 and 19 (e.g. three in FIG. 1) injecting three laminar flows of the reactive gas into the chamber 2 of the reactor A. A central injector 18 has the common longitudinal axis with the reactor A. Each of peripheral injectors 17 and 19 has a longitudinal axis in parallel to the longitudinal axis of the reactor A. The central injector 18 has a gas feed line 15a. The peripheral injectors 17 and 19 have a common gas feed line 15b separated from the gas feed line 15a. The gas feed line 15a is connected to a supply of hydrogen gas (not shown), to a supply of a gaseous silicon source via a MFC 20 and to a supply of a gaseous dopant via a MFC 21. The silicon source is, e.g., monosilane, dichlorosilane, trichlorosilane or tetrachlorosilane. The MFC 20 controls the mass flow and further the concentration of the silicon source. The MFC 21 controls the mass flow and further the concentration of the dopant. The gas feed line 15b is also connected to a supply of hydrogen gas, to a supply of the silicon source via a MFC 22 and to a supply of the gaseous dopant via a MFC 23. The MFC 22 controls the mass flow and further the concentration of the silicon source. The MFC 23 controls the mass flow and further the concentration of the dopant.

A concentration control of the reactive gas using the MFCs 20-23 will be described hereinafter.

First, the apparatus 1' determines the temperature of the substrate wafer 3 on the susceptor 4 and the temperature of the chamber 2 of the reactor A so that a silicon epitaxial layer grown on the substrate wafer 3 is slip-free. Then, the MFC 20 controls the mass flow and further the concentration of the silicon source of the reactive gas fed to the central injector 18 and the MFC 21 controls the mass flow and further the concentration of the dopant of the reactive gas fed to the central injector 18 so that the thickness and the resistivity of the central part of the epitaxial layer of the epitaxial wafer 3 have desired values. Then, the MFC 22 controls the mass flow and further concentration of the silicon source of the reactive gas fed to the peripheral injectors 17 and 19 so that the thickness of the peripheral part of the epitaxial layer is equal to that of the central part thereof. Finally, the MFC 23 controls the mass flow and further the concentration of the dopant of the reactive gas fed to the peripheral injectors 17 and 19 so that the resistivity of the peripheral part of the epitaxial layer is equal to that of the central part thereof. Therein the steps, the MFC 22 controls the concentration of the silicon source fed to the peripheral injectors 17 and 19 prior to the dopant concentration control by the MFC 23, since the intake ratio of the dopant changes depending on the silicon source concentration.

The thickness distributions and the resistivity distributions of silicon epitaxial layers grown by the inventive and prior-art apparatuses were tested for comparison.

1. Growth Conditions of Epitaxial Layer and Methods of Determining Layer Thickness and Layer Resistivity Table 1 shows growth conditions of the prior-art process for growing a silicon epitaxial layer on a silicon substrate wafer.

TABLE 1

| Hydrogen | 100 l/min |
|---|---|
| Silicon Source (trichloro silane) | 10 g/min |
| Dopant (50 ppm B$_2$H$_6$) | 0.6 ppb |

Table 2 shows growth conditions of the inventive process for growing a silicon epitaxial layer on a silicon substrate wafer.

TABLE 2

| | Central Part | Peripheral Part |
|---|---|---|
| Hydrogen | 40 l/min | 60 l/min |
| Silicon Source (trichloro silane) | 4 g/min | 5 g/min |
| Dopant (50 ppm B$_2$H$_6$) | 0.6 ppb | 0.4 ppb |

The prior-art apparatus and the inventive apparatus grew p⁻ type silicon epitaxial layers on p+type silicon substrate wafers 3 of 200-mm diameter. Target values of the epitaxial layer thickness and the epitaxial layer resistivity were 2.8 μm and 3.0 Ωcm. After the completion of the growth of epitaxial layers on 50 substrate wafers, epitaxial layer thickness and epitaxial layer resistivity were measured at total 17 points on each silicon epitaxial wafer 3; one point at the center, eight points at 5 mm from the periphery and eight points at centers of radius.

Deviations in the epitaxial layer thickness and the epitaxial layer resistivity were determined by the following expression:

$$\frac{\text{maximum(minimum)} - \text{average}}{\text{average}}$$

2. Test Results 2.1 Epitaxial Layer Thickness.

Figure 2:
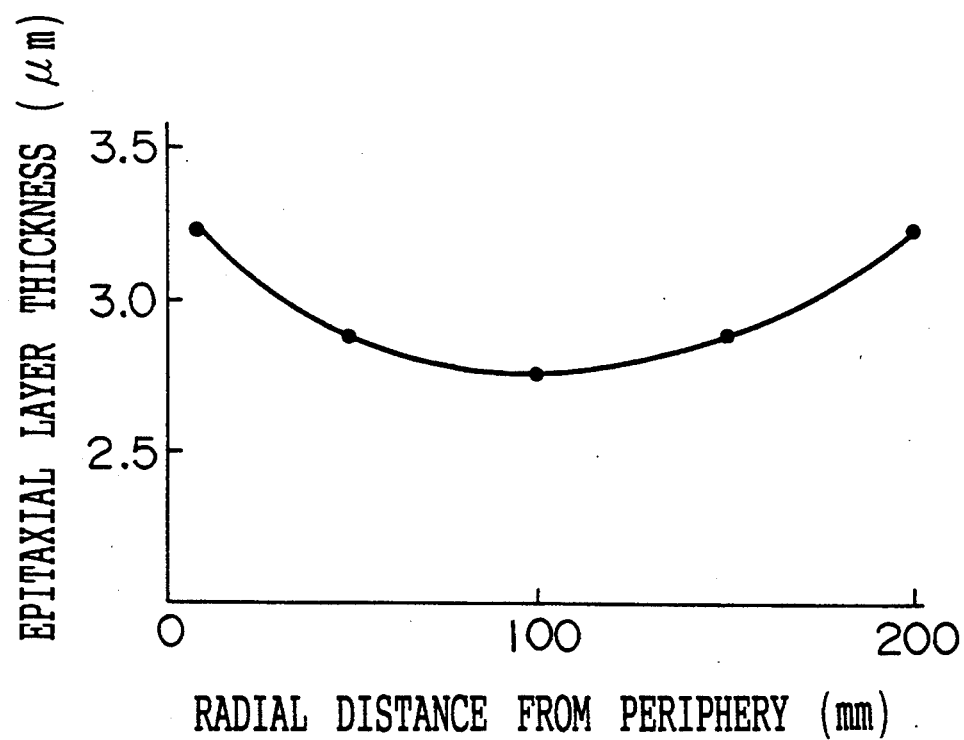
FIG. 2 is a graph of the in-plane thickness distribution of the epitaxial layer of a silicon epitaxial wafer produced by a prior-art apparatus for growing a silicon epitaxial layer.

In the prior-art process, the epitaxial layer thickness of the central part of the epitaxial wafer 3 was thinner than that of the peripheral part and the deviation of the epitaxial layer thickness was large as shown in FIG. 2.

Figure 4:
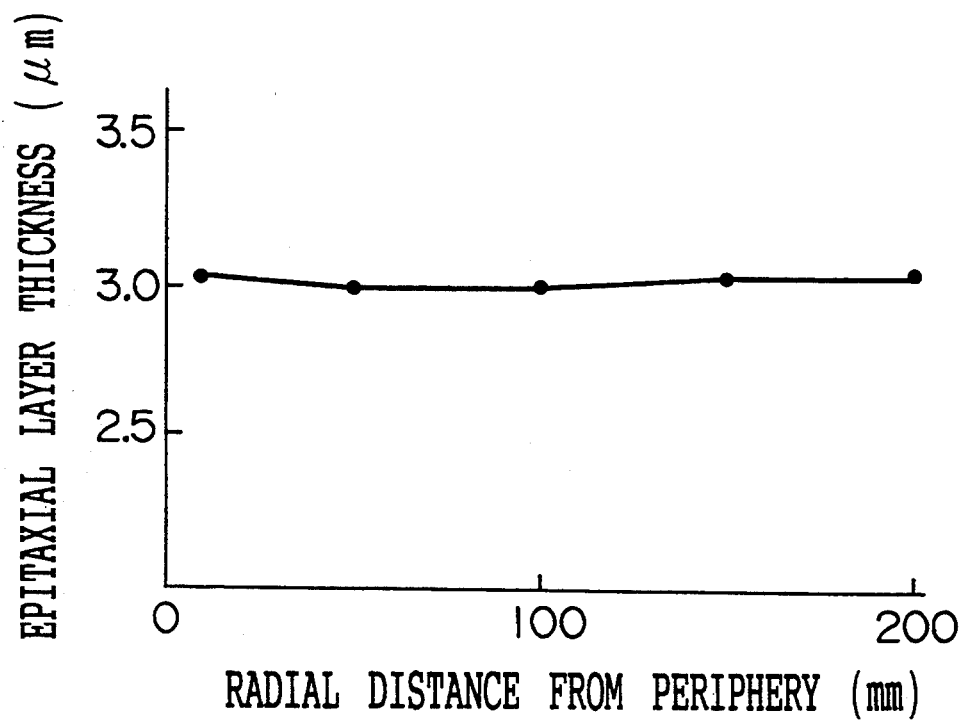
FIG. 4 is a graph of the in-plane thickness distribution of the epitaxial layer of a silicon epitaxial wafer produced by the apparatus of FIG. 1.

In the inventive process, the layer thicknesses of the central, intermediate and peripheral parts of the epitaxial wafer 3 were essentially equal and the deviation of the layer thickness was very small as shown in FIG. 4. Specifically, the deviation of the epitaxial layer thickness according to the prior-art process was 4.2-8.7% and on the other hand, that according to the inventive process was 0.7-1.2%.

2.2 Epitaxial Layer Resistivity.

Figure 3:
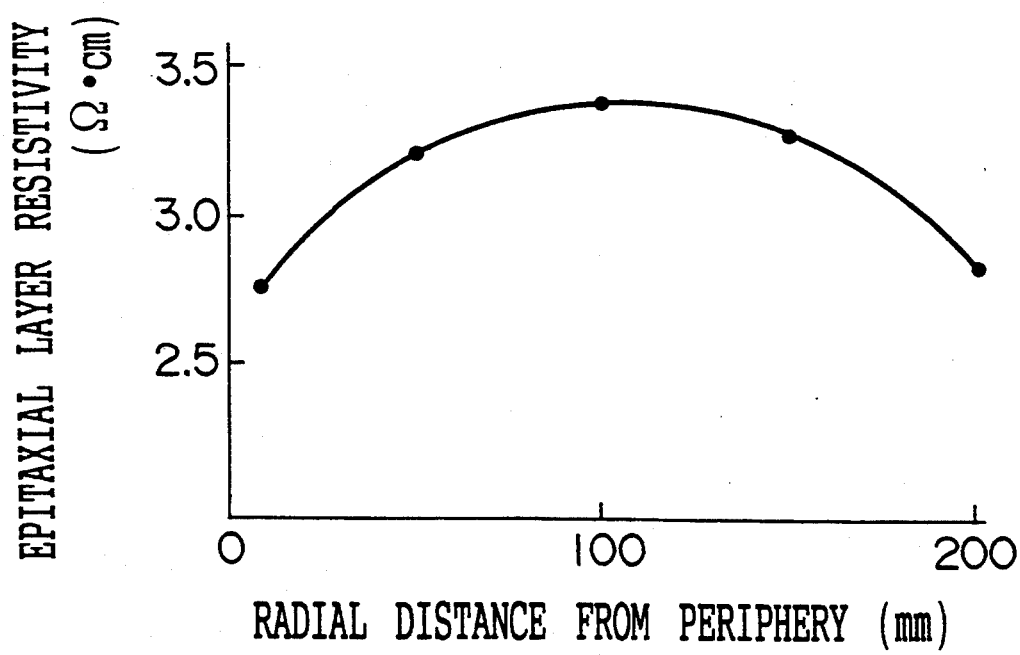
FIG. 3 is a graph of the in-plane resistivity distribution of the epitaxial layer of a silicon epitaxial wafer produced by a prior-art apparatus.

In the prior-art process, the epitaxial layer resistivity of the central part of the epitaxial wafer 3 was higher than that of the peripheral part thereof and the deviation in the epitaxial layer resistivity is large as shown in FIG. 3.

Figure 5:
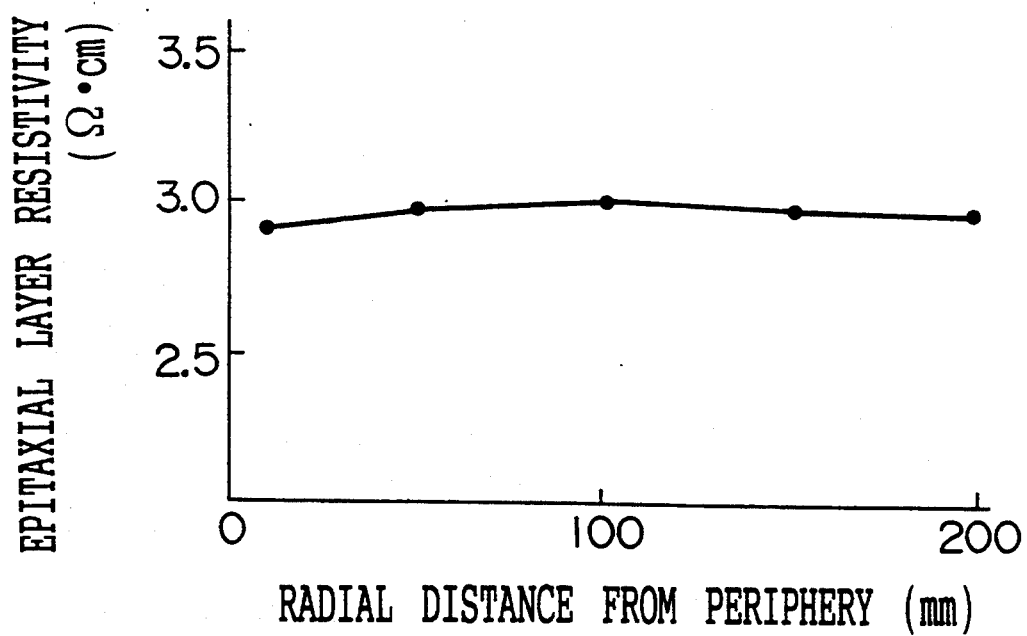
FIG. 5 is a graph of the in-plane resistivity distribution of the epitaxial layer of a silicon epitaxial wafer produced by the apparatus of FIG. 1.

In the inventive process, the layer resistivity of the central, intermediate and peripheral parts of the epitaxial wafer 3 were essentially equal and the deviation in the epitaxial layer resistivity was very small as shown in FIG. 5. Specifically, the deviation in the epitaxial layer resistivity according to the prior-art process was 6.8-10.1% and on the other hand, that according to the inventive process was 1.5-2.1%.

In the first embodiment, the apparatus 1' separately controls the reactive gas concentrations fed from the central injector 18 and the peripheral injectors 17 and 19 so that the in-plane distributions of the epitaxial layer thickness and the epitaxial layer resistivity of the epitaxial wafer 3 are flat. Thus, the inventive apparatus can produce silicon epitaxial wafers of a high quality.

Figure 6:
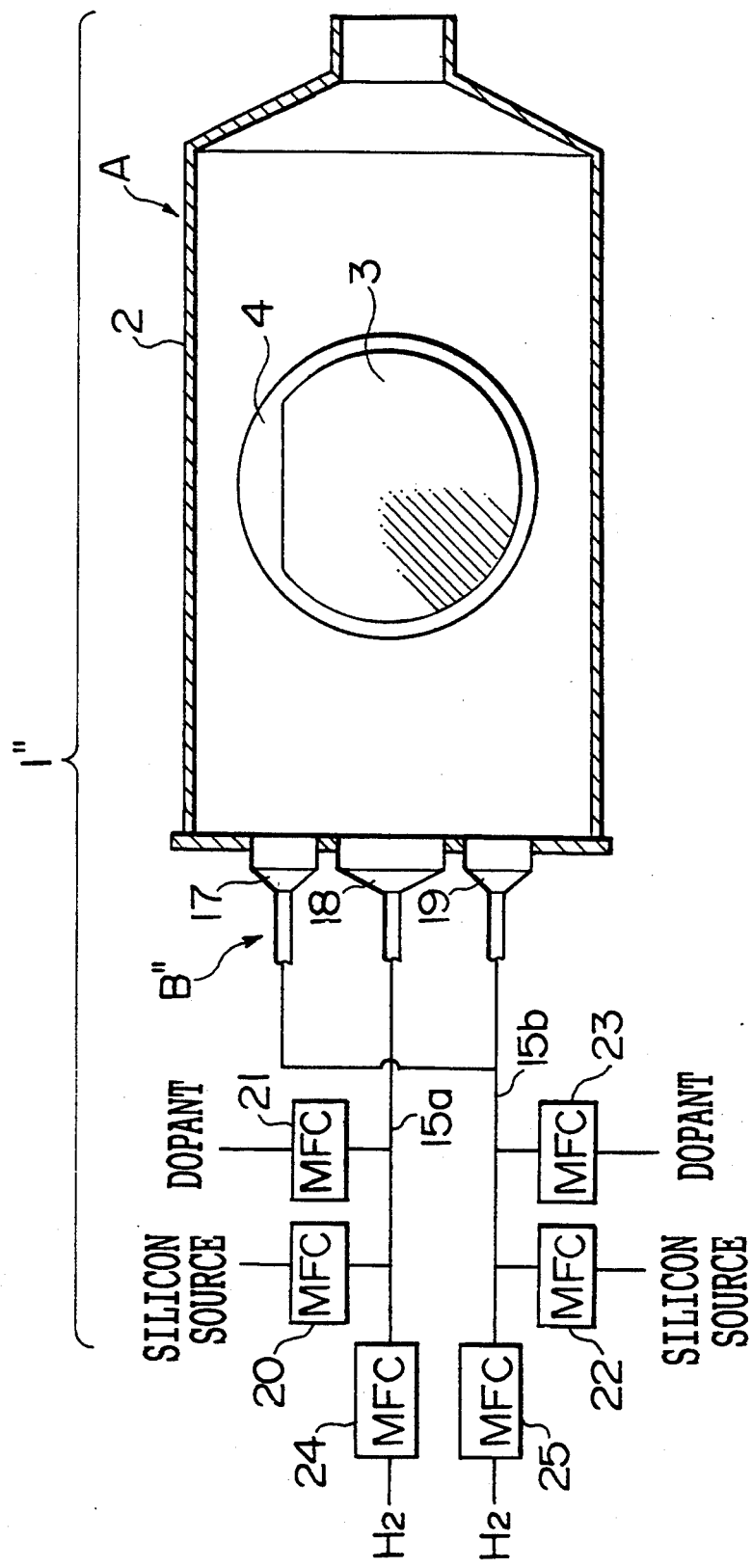
FIG. 6 is a schematic diagram of an apparatus for growing a silicon epitaxial layer according to a second embodiment of the present invention.
Figure 7:
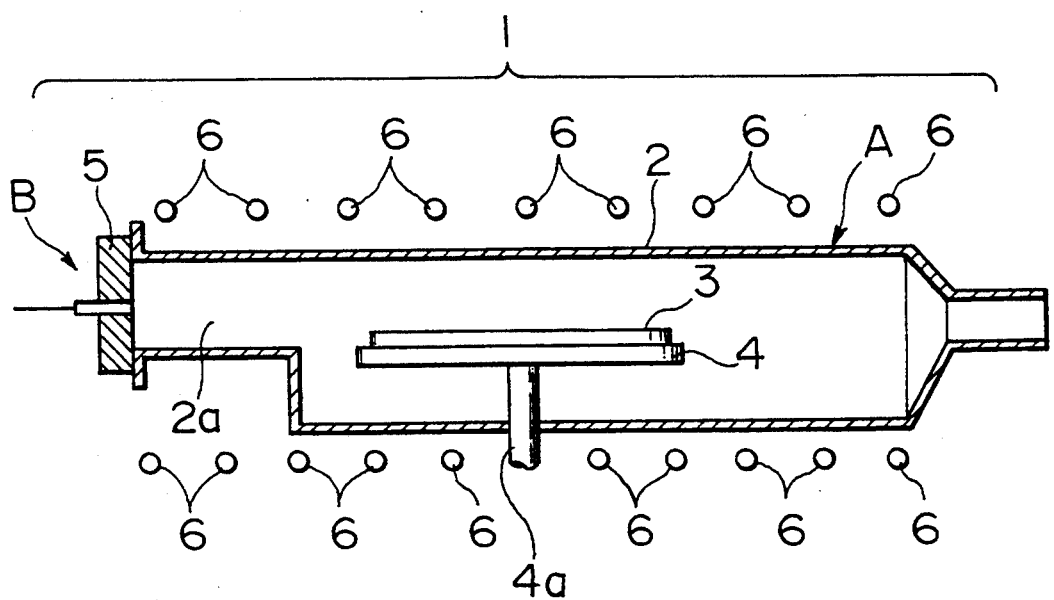
FIG. 7 is a schematic diagram illustrative of a longitudinal sectional side view of the prior-art apparatus for growing a silicon epitaxial wafer.
Figure 8:
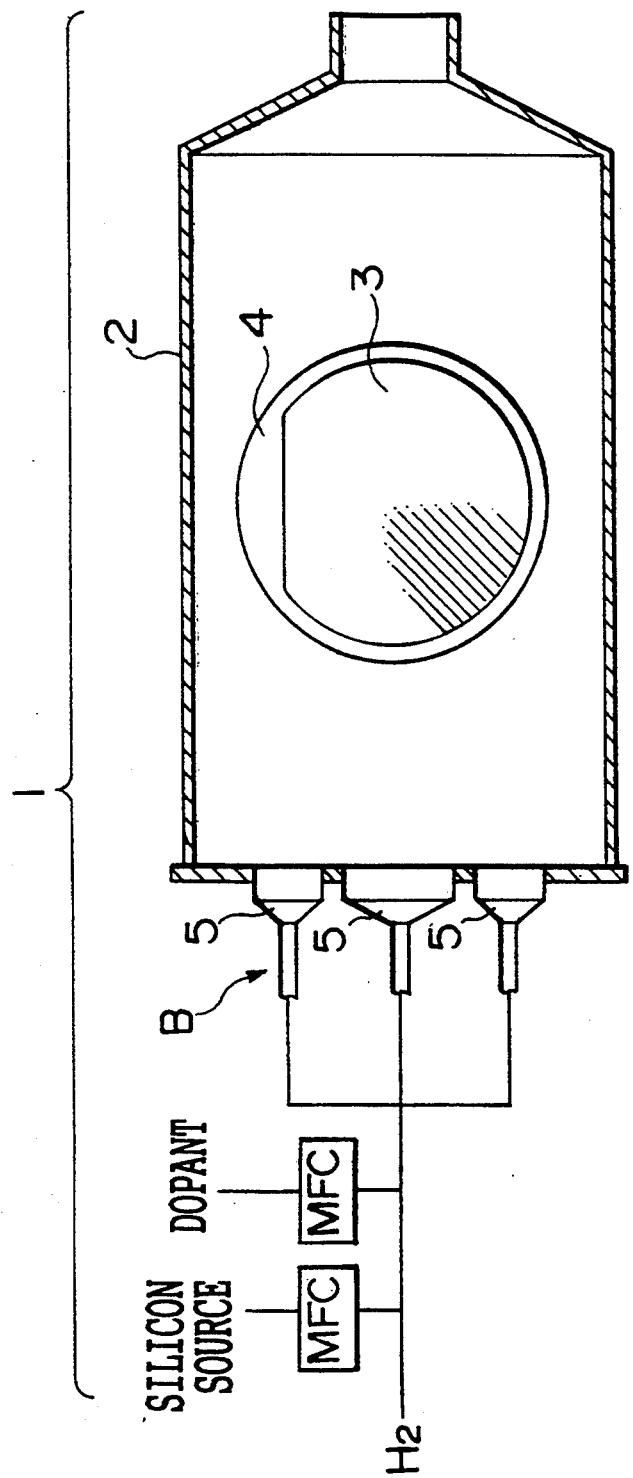
FIG. 8 is a schematic diagram illustrative of a longitudinal sectional plan view of the apparatus of FIG. 7.

FIG. 6 illustrates an apparatus for growing a silicon epitaxial layer on a silicon substrate wafer according to a second embodiment of the present invention. This apparatus 1" has the same structure as the apparatus 1' according to the first embodiment except that the gas feed lines 15a and 15b of the apparatus 1" have MFCs 24 and 25 controlling the mass flows of hydrogen.

Since the apparatus 1" controls accurately not only the concentration but also the flow rate of the silicon source, the dopant and hydrogen by each reactive gas feed line independently, the apparatus 1" produces silicon epitaxial wafers of flatter in-plane distributions in the epitaxial layer thickness and the epitaxial layer resistivity.

The above embodiments have described that the epitaxial layer is doped with a p-type dopant. However, the present invention is applicable to a case in which the epitaxial layer is doped with a n-type dopant and further to the case in which the epitaxial layers are grown on n+-type silicon substrate wafers.

The above embodiments have described the single-wafer-processing apparatuses. However, the present invention is applicable to a batch-processing apparatus for growing in which a single susceptor receives a plurality of substrate wafers during epitaxy.

In an alternative embodiment of the present invention, the apparatus may comprise four or more injectors arranged transversely to the longitudinal axis of the reactor so that the injectors can inject two or more kinds of reactive gas having different concentration and/or different flow rate of silicon source, dopant and/or hydrogen.

The present invention is not rigidly restricted to the embodiments described above. It is to be understood that a person skilled in the art can easily change and modify the present invention without departing from the scope of the invention defined in the appended claims.

What is claimed is:

1. A process for growing a silicon epitaxial layer on a main surface of a slip-free silicon wafer which is held in a horizontal type of a chamber having a cooled wall, comprising the steps of:
   rotating the silicon wafer in a horizontal plane;
   heating the silicon wafer to have a temperature distribution; and
   concurrently feeding parallel flows of reactive gas from a plurality of positions which are arranged in a width direction of the flows into the chamber, the reactive gas comprising a silicon source, a dopant and hydrogen, wherein at least one of the concentrations of the silicon source and the dopant or the flow of the hydrogen in the reactive gas which is fed from a center side in the width direction of the flows is different from that in the reactive gas which is fed from a peripheral side in the width direction of the flows.

2. The process for growing a silicon epitaxial layer as claimed in claim 1, wherein the flow of reactive gas which is fed from the center side in the width direction of the flows is approximately on a center axis of the chamber.

3. The process for growing a silicon epitaxial layer as claimed in claim 1, wherein the growth condition for the process is determined by:
   controlling said step of rotating the silicon wafer in a horizontal plane;
   controlling said step of heating the silicon wafer to have a temperature distribution; and
   individually adjusting at least one of the concentrations of the silicon source and dopant or the flow of hydrogen in the reactive gas in each of the concurrently fed parallel flows of reactive gas.

4. The process for growing a silicon epitaxial layer as claimed in claim 3, wherein the temperature distribution makes the silicon wafer slip-free, and the adjusting step comprises:
   a first adjusting step to establish at least one of the silicon source concentration and the hydrogen flow in the reactive gas which is fed from the center side in the width direction of the flows so that an epitaxial layer having a thickness is formed in the vicinity of a center of the silicon wafer; and
   a second adjusting step to establish at least one of the silicon source concentration and the hydrogen flow from the peripheral side in the width direction of the flows so that the thickness of the epitaxial layer formed in the vicinity of peripheral portions of the silicon wafer is approximately the same as that of the vicinity of the center thereof.

5. The process for growing a silicon epitaxial layer as claimed in claim 3, wherein the adjusting step comprises:
   a first adjusting step to establish at least one of the silicon source concentration and the hydrogen flow in the reactive gas which is fed from the center side in the width direction of the flows so that an epitaxial layer having a thickness is formed in the vicinity of the center of the silicon wafer;
   a second adjusting step to establish at least one of the silicon source concentration and the hydrogen flow from the peripheral side in the width direction of the flows so that the thickness of the epitaxial layer formed in the vicinity of the peripheral portions of the silicon wafer is approximately the same as that of the vicinity of the center thereof; and
   a third adjusting step to establish at least one of the dopant concentration and the hydrogen flow in the reactive gas in the width direction of the flows so that the resistivity of the epitaxial layer formed in the vicinity of the peripheral portions of the silicon wafer is approximately the same as that of the vicinity of the center thereof.

6. The process for growing a silicon epitaxial layer as claimed in claim 5, wherein the flow of reactive gas which is fed from the center side in the width direction of the flows is approximately on a center axis of the chamber.

7. The process for growing a silicon epitaxial layer as claimed in claim 5, wherein the silicon wafer is held on a susceptor, and the temperature distribution of the susceptor is controlled so that the temperatures of a center and peripheral portions thereof are approximately the same.

8. The process for growing a silicon epitaxial layer as claimed in claim 7, wherein the susceptor is a single-wafer-processing type.

9. The process for growing a silicon epitaxial layer as claimed in claim 3, wherein the temperature distribution makes the silicon wafer slip-free, and the adjusting step comprises:
   a first adjusting step to establish at least one of the concentrations of the silicon source and the dopant or the flow of the hydrogen in the reactive gas which is fed from the center side in the width direction of the flows so that an epitaxial layer having a predetermined thickness and a resistivity is formed in the vicinity of a center of the silicon wafer;
   a second adjusting step to establish at least one of the silicon source concentration and the hydrogen flow in the reactive gas which is fed from the peripheral side in the width direction of the flows so that the thickness of the epitaxial layer formed in the vicinity of peripheral portions of the silicon wafer is approximately the same as that of the vicinity of the center thereof; and
   a third adjusting step to establish at least one of the dopant concentration and the hydrogen flow in the reactive gas which is fed from the peripheral side in the width direction of the flows so that the resistivity of the epitaxial layer formed in the vicinity of the peripheral portions of the silicon wafer is approximately the same as that of the vicinity of the center thereof.

* * * * *